(12) United States Patent
Hatem et al.

(10) Patent No.: US 9,236,257 B2
(45) Date of Patent: Jan. 12, 2016

(54) TECHNIQUES TO MITIGATE STRAGGLE DAMAGE TO SENSITIVE STRUCTURES

(71) Applicant: Varian Semiconductor Equipment Associates, Inc., Gloucester, MA (US)

(72) Inventors: Christopher R. Hatem, Salisbury, MA (US); Anthony Renau, West Newbury, MA (US); John J. Hautala, Beverly, MA (US); Ludovic Godet, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/799,022

(22) Filed: Mar. 13, 2013

(65) Prior Publication Data

US 2014/0273502 A1    Sep. 18, 2014

(51) Int. Cl.
*H01L 21/31* (2006.01)
*H01L 21/20* (2006.01)
*H01L 21/00* (2006.01)
(Continued)

(52) U.S. Cl.
CPC .......... *H01L 21/2236* (2013.01); *C23C 14/042* (2013.01); *C23C 14/48* (2013.01); *H01J 37/3171* (2013.01); *H01J 37/32357* (2013.01); *H01J 37/32422* (2013.01); *H01J 37/32899* (2013.01); *H01L 21/266* (2013.01);
(Continued)

(58) Field of Classification Search
CPC . H01L 21/265; H01L 21/8238; H01L 27/092; H01L 21/3205; H01L 21/00; H01L 21/266; C23C 14/48; B01J 17/00; G03C 5/00
USPC .......... 438/478, 373, 506, 766, 3, 40–45, 57, 438/73, 155, 257, 268, 283, 390, 400, 438/513–519, 524–527; 257/E21.057, 257/365–369, E21.346, E21.334–E21.336, 257/E21.214, E21.008, E21.421, E21.121, 257/E21.43
See application file for complete search history.

(56) References Cited

U.S. PATENT DOCUMENTS 4,144,101 A    3/1979  Rideout
5,217,924 A *  6/1993  Rodder et al. ................ 438/301
(Continued)

FOREIGN PATENT DOCUMENTS

JP    09-162137 A    6/1997
JP    2007-096245 A    4/2007

OTHER PUBLICATIONS

International Search Report and Written Opinion mailed Jun. 30, 2014 for PCT/US2014/023473 Filed Mar. 11, 2014.

*Primary Examiner* — Amar Movva
*Assistant Examiner* — Sheikh Maruf

(57) ABSTRACT

A method for processing a substrate includes providing a set of patterned structures separated by a first gap on the substrate and directing first implanting ions to the substrate at a first ion energy, where the first implanting ions are effective to impact the substrate in regions defined by the first gap. The method also includes directing depositing ions to the substrate where the second ions are effective to deposit material on at least a portion of the set of patterned structures to form expanded patterned structures, where the expanded patterned structures are characterized by a second gap smaller than the first gap. The method further includes directing second implanting ions to the substrate at a second ion energy, where the second implanting ions effective to impact the substrate in regions defined by the second gap, the second ion energy comprising a higher ion energy than the first ion energy.

12 Claims, 8 Drawing Sheets

(51) Int. Cl.
   *H01L 21/223*   (2006.01)
   *H01L 21/265*   (2006.01)
   *H01L 21/266*   (2006.01)
   *H01L 43/12*    (2006.01)
   *C23C 14/48*    (2006.01)
   *H01J 37/317*   (2006.01)
   *H01J 37/32*    (2006.01)
   *H01L 21/67*    (2006.01)
   *H01L 21/677*   (2006.01)
   *C23C 14/04*    (2006.01)

(52) U.S. Cl.
   CPC ..... *H01L 21/26513* (2013.01); *H01L 21/6776* (2013.01); *H01L 21/67213* (2013.01); *H01L 43/12* (2013.01)

(56) References Cited

U.S. PATENT DOCUMENTS

| | | | |
|---|---|---|---|
| 5,523,241 A * | 6/1996 | Wan et al. | 438/73 |
| 6,165,811 A | 12/2000 | Lee et al. | |
| 6,670,103 B2 | 12/2003 | Chang | |
| 7,288,491 B2 | 10/2007 | Collins et al. | |
| 2006/0030167 A1* | 2/2006 | Henley | 438/798 |
| 2006/0156979 A1* | 7/2006 | Thakur et al. | 118/715 |
| 2009/0179272 A1* | 7/2009 | Campi et al. | 257/365 |
| 2011/0124186 A1* | 5/2011 | Renau et al. | 438/513 |
| 2012/0064694 A1* | 3/2012 | Booth et al. | 438/390 |
| 2012/0070969 A1* | 3/2012 | Tanaka | 438/527 |
| 2012/0112280 A1* | 5/2012 | Johnson et al. | 257/347 |
| 2014/0072397 A1* | 3/2014 | Mooring | 414/805 |
| 2014/0147985 A1* | 5/2014 | John et al. | 438/424 |
| 2014/0167143 A1* | 6/2014 | Schmidt | 257/329 |
| 2014/0174354 A1* | 6/2014 | Arai | 118/719 |

* cited by examiner

TECHNIQUES TO MITIGATE STRAGGLE DAMAGE TO SENSITIVE STRUCTURES

BACKGROUND OF THE INVENTION

1. Field of the Invention

Embodiments relate to the field of substrate patterning an more particularly to processing patterned substrates with ions.

2. Discussion of Related Art

Modern devices such as processors, semiconductor memory, magnetic, optical and other storage devices, as well as microelectomechanical (MEMS) devices continue to scale to smaller dimensions, which affords greater performance, efficiency, and economy. In order to facilitate shrinking of device dimensions patterning techniques such as lithography and etching, and substrate cleaning continue to undergo improvement. However, the shrinking of device dimensions places challenges on various substrate processing techniques in particular because of the absolute size of substrate features as well as aspect ratio and material properties of such features. In one example ion beam or plasma processing have found increasing use for etch and cleaning steps for various substrate device technologies.

In the example of bit patterned media, ion beam processing has been identified as a technique for cleaning as well as magnetic deadening of device structures. However, such ion beam processing may introduce damage to sidewall structures caused by straggle of implanted ions. In the case of patterning of magnetic random access memory (MRAM) one type of cleaning step requires the removal of residue within a gap between adjacent fin-like structures. Because straggle or lateral movement of implanted ions scales with the implanted ion energy, the use of ion beams to clean such structures may require the use of very low energy for present day device dimensions to ensure that unwanted damage, such as sidewall damage, is minimized. Such low ion energy however, may compromise the cleaning or etch process in regions of the structures where cleaning is desired.

SUMMARY

In view of the above, it will be appreciated that there is a need to improve ion processing technologies to process patterned structures while minimizing unwanted damage. Embodiments of the present invention are directed to methods and structures for improved. In one embodiment, a method of processing a substrate includes providing a set of patterned structures separated by a first gap on the substrate. The method further includes directing first implanting ions to the substrate at a first ion energy during a first exposure, where the first implanting ions are effective to impact the substrate in regions defined by the first gap. The method also includes directing depositing ions to the substrate in a second exposure subsequent to the first ion exposure, the second ions effective to deposit material on at least a portion of the set of patterned structures to form expanded patterned structures, were the expanded patterned structures are characterized by a second gap smaller than the first gap. The method includes directing second implanting ions to the substrate at a second ion energy during a third exposure subsequent to the second exposure, where the second implanting ions are effective to impact the substrate in regions defined by the second gap, the second ion energy comprising a higher ion energy than the first ion energy.

In another embodiment, a method of patterning a substrate includes forming a set of patterned structures on the substrate, where the patterned structures are defined by a first gap that separates adjacent patterned structures. The method also includes directing depositing ions over a range of angles of incidence to the substrate, where the depositing ions are effective to deposit material on at least a portion of the set of patterned structures to form expanded patterned structures, where the expanded patterned structures are characterized by a second gap between adjacent patterned structures that is smaller than the first gap. The method further includes directing implanting ions to the substrate in substrate regions between adjacent patterned structures during an implantation exposure subsequent to the deposition exposure, where the implanting ions are effective to impact the substrate in regions defined by the second gap, wherein an implant width of the implanted substrate regions is equal to about the first gap.

DESCRIPTION OF EMBODIMENTS

Figure 1A:
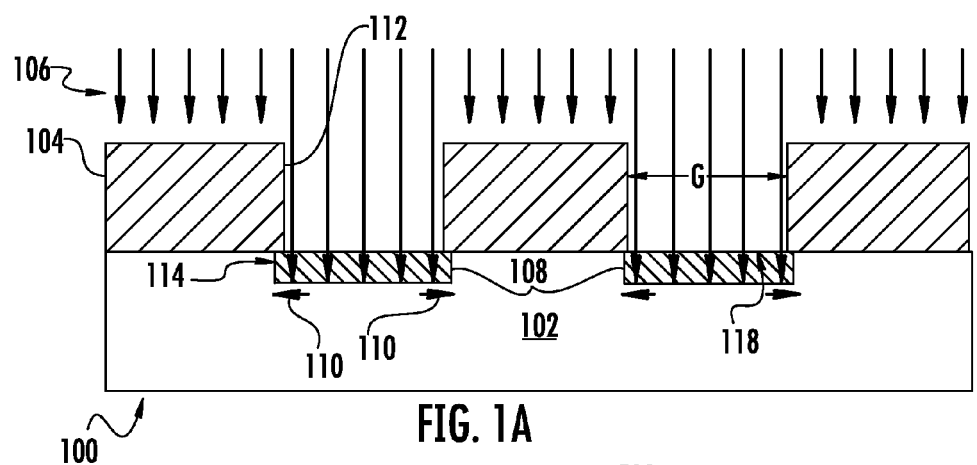
FIGS. 1A to 1G depict various processes involved in patterning a substrate consistent with the present embodiments.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

In various embodiments, novel substrate processing is disclosed using a combination of deposition on patterned substrate structures with screen ion implantation. In particular embodiments, one or more ion implantation and/or etching treatments are interspersed with one or more deposition steps. Consistent with particular embodiments ion energy may be scaled upwardly between successive ion implantation/etching treatments. In such processes a deposition process interspersed between successive first and second ion implantation/etch treatment is employed to close a gap between neighboring structures, thereby limiting the line of site of ions incident upon the structures during the second ion treatment. In this manner lateral straggle of ions during the second ion treatment is controlled and may be limited to regions within a desired implantation region.

Figure 1B:
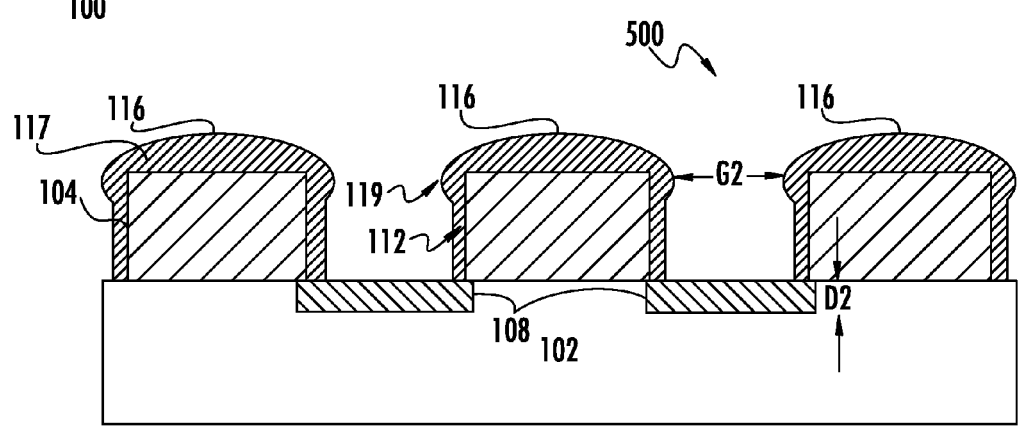
Figure 1C:
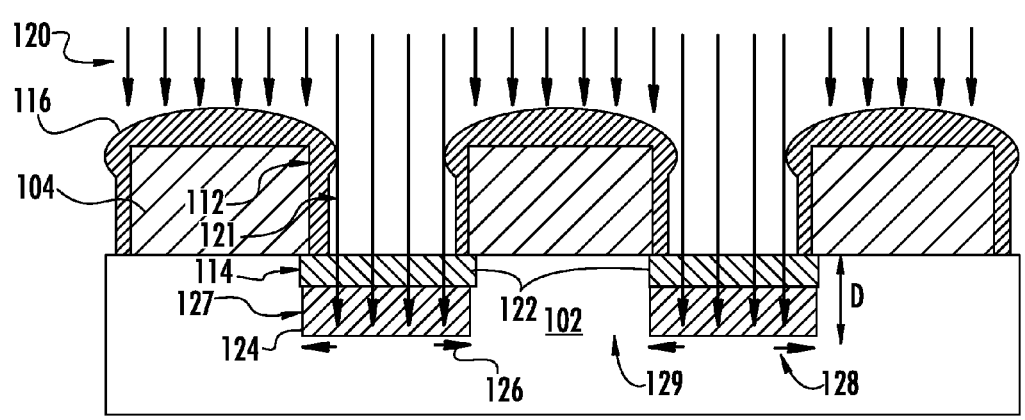

FIGS. 1A to 1C depict different operations involved in processing a substrate according to the present embodiments. The base 102 of substrate 100 may comprise one or more layers, but is shown as a single layer for purposes of illustration. A set of patterned structures 104 is provided on the base 102 in order to mask portions of the base 102 to subsequent processing. In the example of FIG. 1A ions 106 are directed toward the substrate 100 to perform ion implantation in portions of the base 102 that are not covered by the patterned structures 104. The ions 106 may be used to introduce dopants into select regions of the substrate 100 in one example in which the base 102 includes a semiconductor region. In another example, the ions 106 may be used to render select regions of the substrate 100 inactive such as in a magnetic memory discussed further below.

Figure 1D:
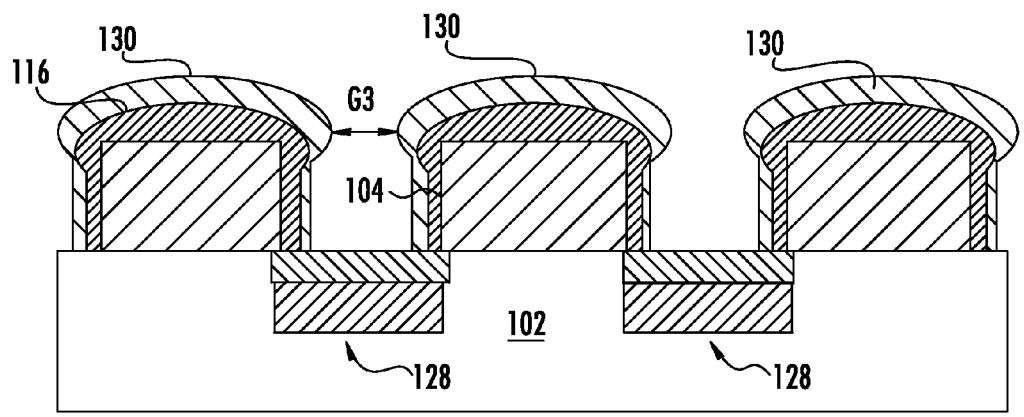
Figure 1E:
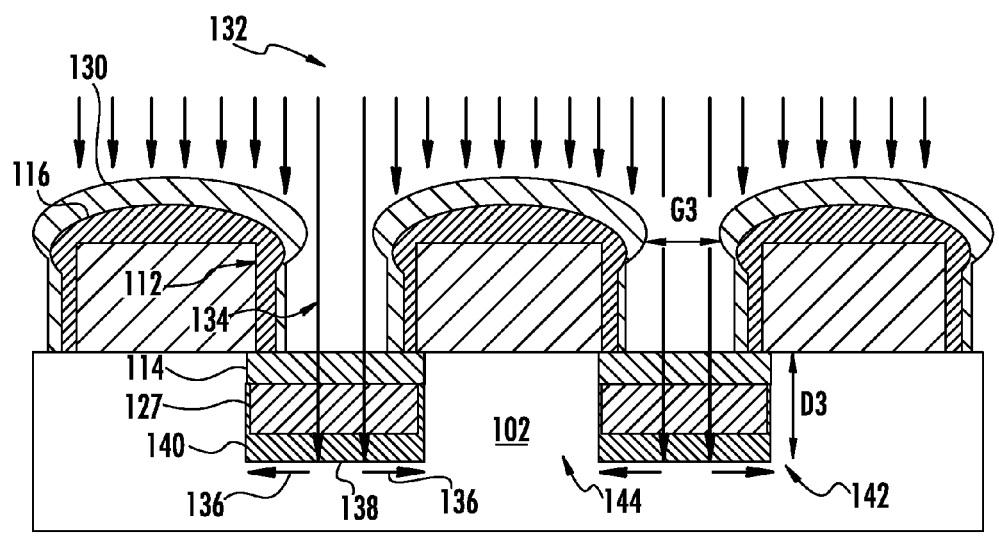
Figure 1F:
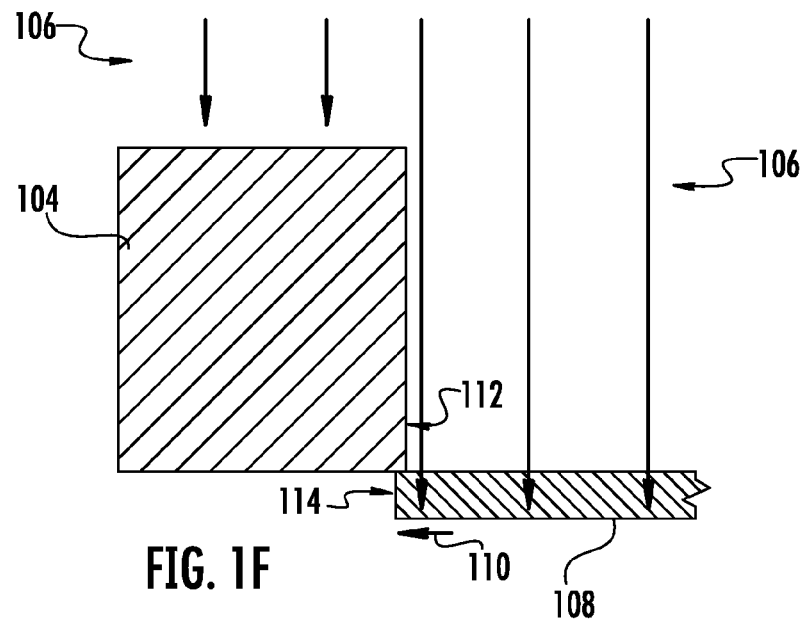

In the example of FIGS. 1A to 1C ion implantation is to be performed in unmasked regions of the base 102 to a predetermined depth D as illustrated in FIG. 1C. However, to ensure that ion damage to regions of the base 102 underneath the patterned structures 104 remains minimal, a deep ion implantation process shown in FIG. 1C is not performed until after a deposition process that forms tops 117 shown in FIG. 1B. In particular, in the process shown in FIG. 1A, a shallow ion implantation process is performed using the ions 106. The ion energy of ions 106 may be set to a level in which lateral straggle (or simply "straggle") 110 is within a designed range such that the shallow implantation region 108 does not encroach excessively under the patterned structures 104. Accordingly, the depth D2 of the shallow implantation region 108 may be less than the predetermined depth D. As shown in FIG. 1A, because the ion energy for ions 106 is relatively low, the straggle 110 is relatively low. In one example, the trajectories of ions 106 may be perpendicular to a plane 118 of the substrate 100 before the ions impact the substrate 100. Accordingly, the ions are shadowed by the patterned structures 104 at the edges 112. FIG. 1F presents a close-up view of the edge of a patterned structure 104 during the stage illustrated in FIG. 1A. The total area that ions 106 may impact the base 102 is therefore defined by the value of G between adjacent patterned structures 104. Unshadowed ions that impact the base 102 in regions close to the edge 114 and implant into the base 102 may therefore travel laterally within the base 102 to an extent defined by the magnitude of straggle 110. Accordingly, because the straggle 110 is relatively low, the edge 114 of the implantation region 108 is close to the edge 112 of the patterned structures 104.

In order to implant the base 102 to the depth D, a second, deeper, implantation is performed as shown in FIG. 1C. However, a deeper implantation process requires higher ion energy for a given ion species which also results in greater straggle. In order to locate the edge of a deeper implantation region close to or coincident with the edge 114, the gap between neighboring or adjacent patterned structures 104 is reduced before the deep implantation is performed. Referring to FIGS. 1A and 1B, initially patterned structures 104 are separated by a gap G shown in FIG. 1A. Subsequently, in FIG. 1B, a deposition process is performed which results in formation of material on the patterned structures 104, resulting in expanded patterned structures 116. The expanded patterned structures 116 may be formed by known deposition processes including chemical vapor deposition, ion assisted deposition, or other deposition process. In the example shown, the expanded patterned structures 116 have mushroom like tops as viewed in cross-section, which define a smaller gap G2 between adjacent expanded patterned structures 116. The smaller gap G2 defines a total area in which ions may impact the base 102. In particular, the edge 119 of each gap is located away from the edge 112 of the original patterned structures 104. Accordingly, the "view factor" for subsequent ions, which represents the projected area of the base 102 that is exposed to line of sight ions, is reduced after the formation of the expanded patterned structures 116.

Figure 1G:
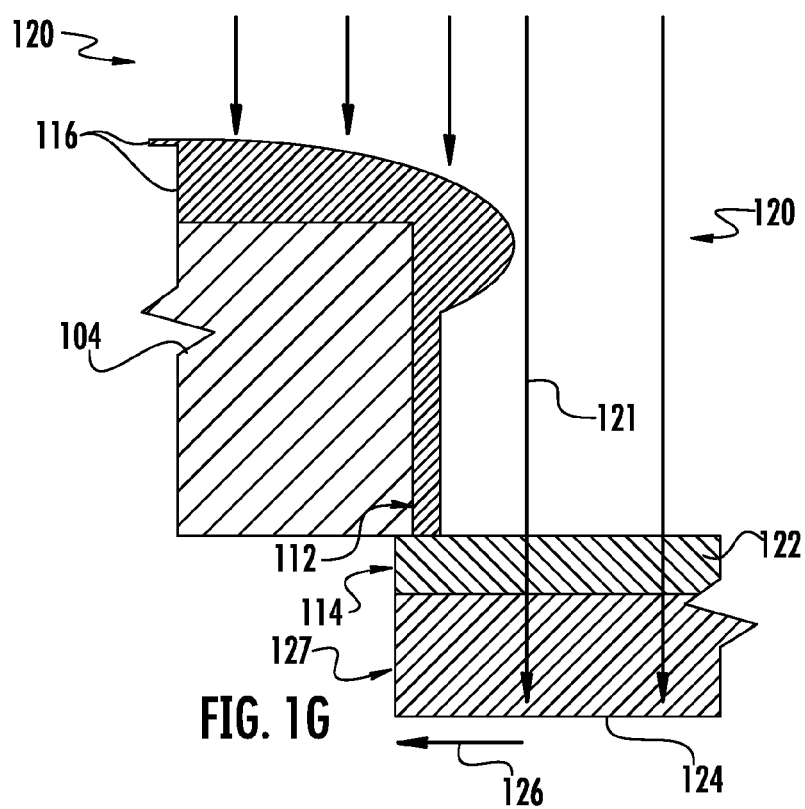

Subsequently, when high energy ions 120 are implanted into the base 102, the edge 121 of the high energy ions 120 is displaced away from the edge 112 as shown in the close-up of the process of FIG. 1C shown in FIG. 1G. Accordingly, when the high energy ions 120 implant into the substrate 100, a greater straggle 126 may be accommodated without damage to regions under the patterned structures 104. As shown, the high energy ions 120 create a deep implantation region 124 and doubly implanted region 122. However, because of the smaller gap G2, the greater straggle 126 only results in creating a deep implantation region 124 whose edge 127 is close to or coincident with the edge 114. In this manner, the screening provided by the deposition in FIG. 1B results in generating a width of the composite implantation region 128 that is relatively constant as a function of depth in the base 102. This also leads to formation under each patterned structure 104 of an unimplanted region 129 that also has a relatively constant width as a function of depth in the base 102.

In some embodiments, the process cycle illustrated in FIGS. 1B and 1C may be iterated in one or more additional process cycles of deposition and implantation. FIGS. 1D to E depict one such additional process cycle that may follow the processes illustrated in FIGS. 1A to 1C. After formation of the composite implantation region 128 a further deposition is performed, which results in the formation of the expanded patterned structures 130. As shown in FIG. 1D, the expanded patterned structures 130 include a larger mushroom type feature that creates a smaller gap G3 between adjacent expanded patterned structures 130. This creates a still smaller view factor for ions subsequently directed to the substrate 100 in regions between the expanded patterned structures 130, as shown in FIG. 1E. In the instance shown in FIG. 1E ions 132 are directed to the substrate 100 and only those that pass through the gap G3 implant into the base 102. The edge 134 of the ions 132 is displaced away from the edge 112 as shown. Accordingly, when the ions 132 implant into the base 102, a greater straggle 136 may be accommodated without damage to regions under the patterned structures 104. As shown, the high energy ions 132 create a deeper implantation region 138. However, because of the smaller gap G3, the greater straggle 136 only results in creating a deeper implantation region 138 whose edge 140 is close to or coincident with the edges 114 and 127. In this manner, the screening provided by the deposition in FIG. 1E results in the ability to generate a width of the composite implantation region 142 that is relatively constant as a function of depth in the base 102. This also leads to formation under each patterned structure 104 of an unimplanted region 144 that also has a relatively constant width as a function of depth in the base 102.

Figure 2A:
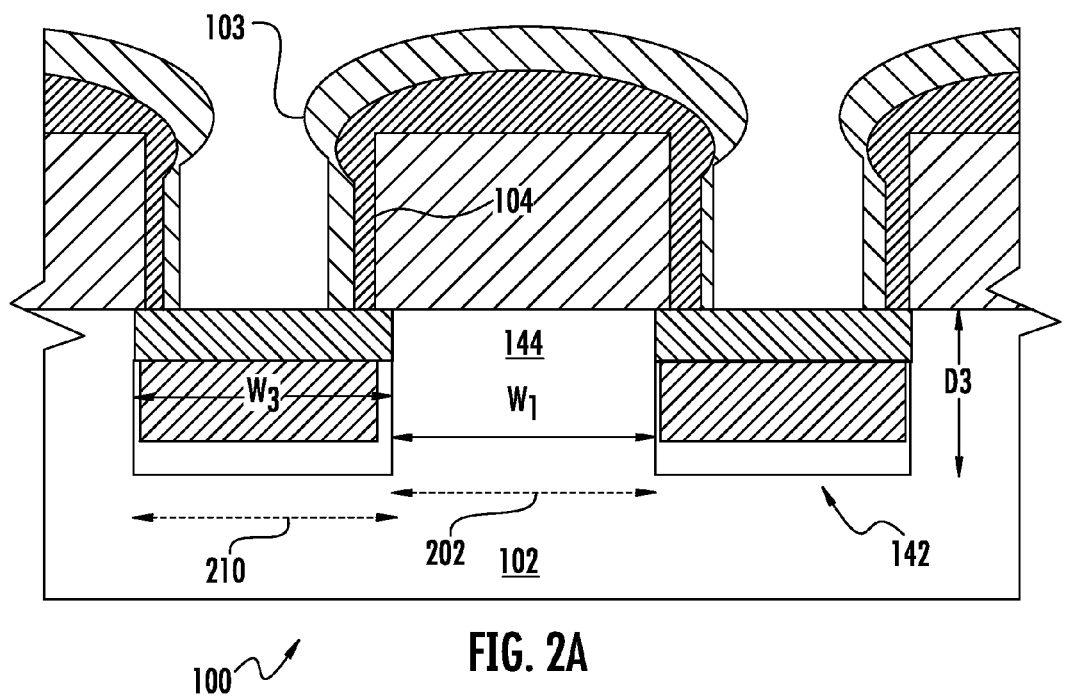
FIG. 2A illustrates details of a substrate patterned according to the present embodiments.
Figure 2B:
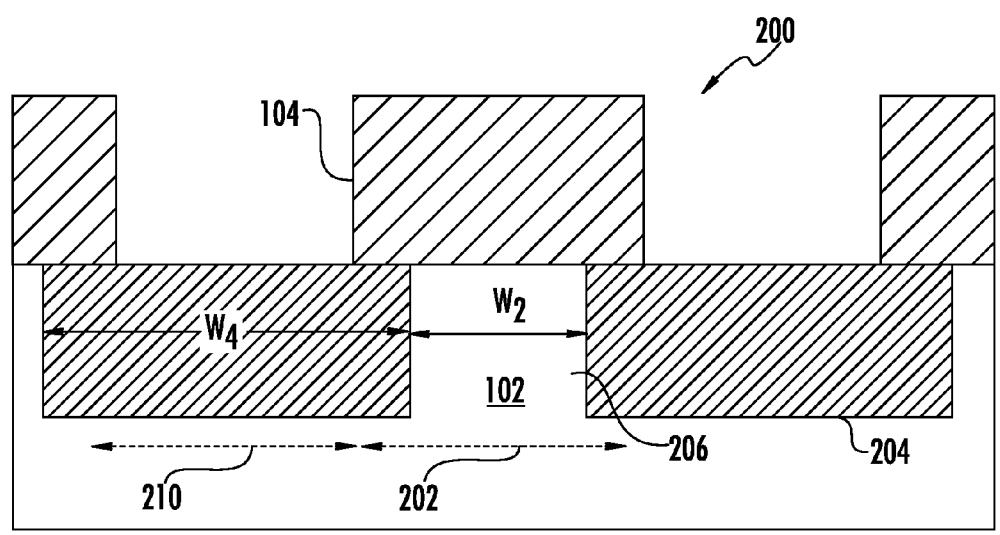
FIG. 2B illustrates details of a substrate patterned according to conventional techniques.

The above process outlined in FIGS. 1A to 1G affords multiple advantages for patterning substrates in comparison to conventional approaches. For one, the process affords the ability to decouple the implantation width from implantation depth for a region to be implanted in a manner not achieved by conventional approaches. This is illustrated by FIGS. 2A and 2B which depict an exemplary patterned substrate structure consistent with the present embodiments and a conventional patterned substrate, respectively, For purposes of illustration, it may be assumed that a device design specifies a design width 202 and depth D3 for an active region of a device that is separated by an unimplanted region. The implantation may be used to isolate adjacent active areas from one another for example. In particular, the design width 202 and depth D3 may be used to define an active region of a memory device as detailed further below.

In FIG. 2A the structure of a substrate 100 is shown after the processing discussed above with respect to FIGS. 1A-1G. As shown, the composite implantation region 142 whose depth is D3 also has a width $W_3$, which defines a width $W_1$ for the unimplanted region 144. As illustrated, the width $W_1$ closely approximates the design width 202. This is achieved by the iterative processes detailed above with respect to FIGS. 1A to 1E.

In contrast the conventional structure 200 shown in FIG. 2B does not achieve the desired dimensions D3 and design width 202. The conventional structure 200 is fabricated by implantation into the substrate base 102 in the presence of the patterned structures 104. In order to achieve the proper depth D3 for an active region, the ion energy for implantation to form the implantation region 204 is set to a value that is sufficiently high to cause implantation to the depth D3. However, this engenders a straggle that causes the implantation regions 204 to substantially undercut the patterned structures 104, leading to a width $W_2$ for the unimplanted region 206 that is much smaller than the design width 202.

In a different example, a device design may specify a depth D3 and design width 210 for a doped substrate region to be formed by ion implantation. As further illustrated in FIG. 2A, the present embodiments are able to achieve the specified depth D3 and design width 210, which is approximated by the width $W_3$ of the composite implantation region 142 shown. As discussed above, the present embodiments are able to achieve a uniform implantation width as a function of depth by depositing material on the patterned structures 104 to narrow the gap between adjacent patterned structures and thereby narrow the region of the base 102 that initially intercepts implanting ions. This affords the ability to perform deeper implantation as needed, since the increased lateral straggle at high energies can be compensated for by the greater distance of ions from the initial edge of the patterned structures 104 caused by the expanded patterned structures 130. In contrast, the width $W_4$ of implantation region 204 is substantially greater than design width 210 because the large lateral straggle resulting from ions implanted at sufficient energy to achieve the depth D3 causes ions to implant well under the edges of the patterned structures 104.

Figure 3A:
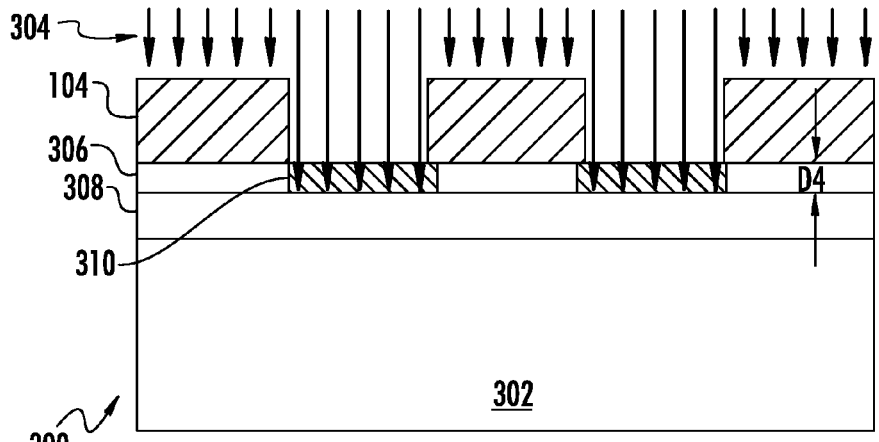
FIGS. 3A to 3C depict various processes involved in patterning a substrate consistent with the present embodiments.
Figure 3B:
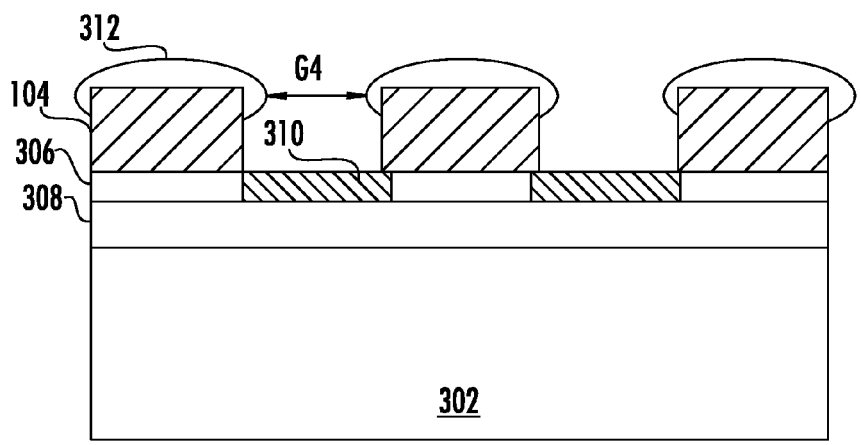
Figure 3C:
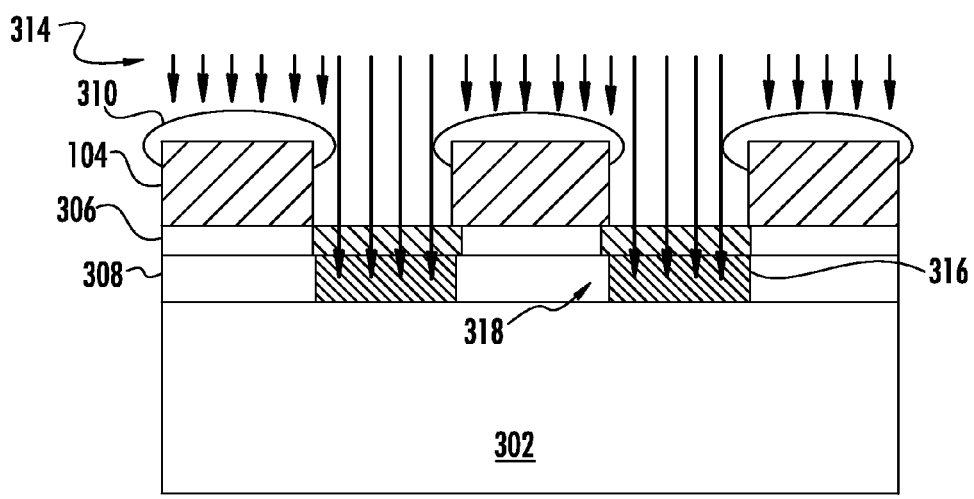

FIGS. 3A to 3C depict operations involved in processing a substrate according to additional embodiments. In this case the substrate 300 includes multiple layers including a base layer 302 and overlayer 308 and top layer 306. The substrate 300 is further provided with a set of patterned structures 104 on the base layer 302 in order to mask portions of the base layer 302 to subsequent processing. In the example of FIG. 3A ions 304 are directed toward the substrate 300 to perform ion implantation in portions of the substrate 300 that are not covered by the patterned structures 104. The ions 304 may be used to introduce dopants into select regions of the substrate 300 in one example in which the substrate 300 includes a semiconductor region. In another example, the ions 304 may be used to render select regions of the substrate 300 inactive such as in a magnetic memory discussed further below.

In the example of FIGS. 3A to 3C a set of multiple ion implantation processes are performed. The multiple ion implantation processes may be tailored according to the layer thickness of layers to be implanted in one example. For instance, as illustrated in FIG. 3A ions 304 are implanted to a depth D4 corresponding to the thickness of top layer 306. The top layer 306 may be sufficiently thin as to require only a low ion energy for ions to implant to the depth D5 in one example. This may result in minimal straggle such that implanted regions 310 do not encroach significantly under the patterned structures 104.

Subsequently, as shown in FIG. 3B, deposition is performed to create the expanded patterned structures 312. Finally, as illustrated in FIG. 3C another ion implantation process is performed. In this case, the ion energy of ions 314 is designed to implant to a depth corresponding to the bottom of overlayer 308 so that the entire overlayer 308 is implanted in regions not masked by the expanded patterned structures 312. Thus, the ion energy used in the process of FIG. 3C to form the implantation region 316 is higher than that used to implant the top layer 306. Because of the reduced gap G4 between adjacent expanded patterned structures 312, the resulting width of the composite implantation region 318 may be the same in both top layer 306 and overlayer 308.

In addition to changing the ion energy between successive implantation operations, the ion dose in each of multiple implantation steps may be tailored to achieve the desired overall ion dose within the region to be implanted. Also, in further embodiments, the composition of ion species may be varied between implantation operations. Returning to FIGS. 3A to 3B, in one example the top layer 306 and overlayer 308 may represent different layers in a stack of magnetic memory layers whose chemical and/or physical properties are different from one another. It may be desirable to implant ions into such layers between patterned structures 104 as illustrated in order to magnetically isolate portions of the layers that are disposed underneath the patterned structures 104. The implantation of the proper ion species and dose into exposed regions of top layer 306 and overlayer 308 may render such regions magnetically "dead" after the ion exposure. This serves to define a magnetic element or cell whose width is defined by the width of the unimplanted region underneath a patterned structure 104. Because different combinations of ion species may be effective in magnetically deadening different layers of a memory stack, the composition of ions 304 may be different from the ions 314 in some embodiments for patterning a magnetic memory.

As noted above, multiple iterations of implantation and deposition may be performed to achieve an implanted region of uniform width as a function of depth. In embodiments of patterning magnetic memory it may be necessary to implant into half a dozen or more layers to perform magnetic isolation. In such cases, individual layers may be separately implanted or more than one layer may be implanted in a single implantation step followed by deposition, an additional implantation step and so forth.

Figure 4A:
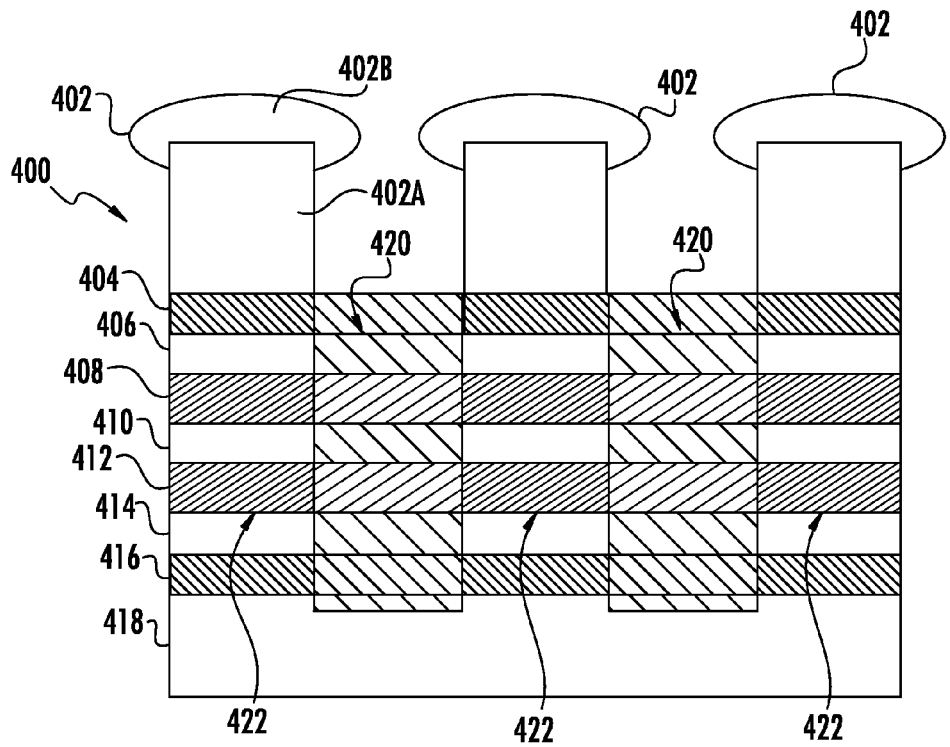
FIG. 4A depicts an exemplary patterned substrate consistent with the present embodiments;—
Figure 4B:
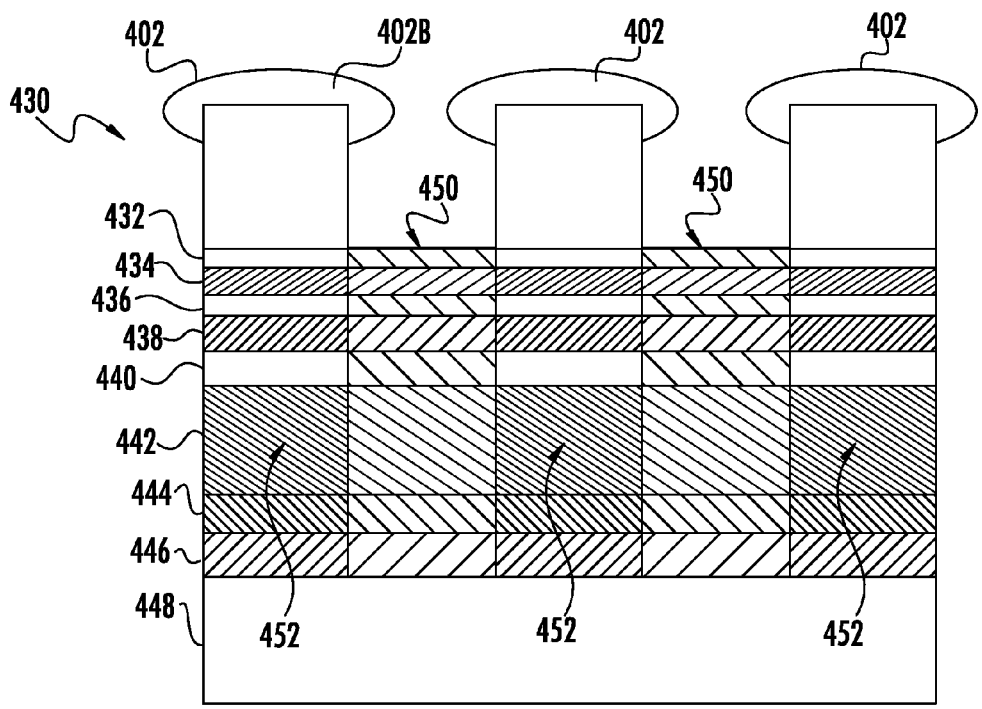
FIG. 4B depicts another exemplary patterned substrate consistent with the present embodiments.

FIGS. 4A and 4B present a cross-sectional depiction of exemplary magnetic memory structures after patterning consistent with the present embodiments. The structure 400 in FIG. 4A includes a set of expanded patterned structures 402 disposed upon a stack of layers 404, 406, 408, 410, 412, 414, 416, and 418. The expanded patterned structures 402 are illustrated as having an original part 402A and cap 402B that represents additional material formed during one or more deposition steps. The structure 400 includes implantation regions 420, which may result from multiple implantation processes as generally shown in the preceding FIGS. The implantation regions 420 serve to magnetically isolate regions 422 that lie under respective expanded patterned structures 402. Because the implantation regions 420 are formed with the aid of caps 402B, deep implantation may be performed without causing straggle of implanting ions to move the border of the implantation regions 420 beyond a desired position. Accordingly, the implantation regions 420 may be maintained at a more uniform width throughout the stack of layers 404-416 as opposed to that achieved by conventional processing.

In one specific example, the layers 404 and 416 may be tantalum, which is used as a contact layer, and the layer 418 may be an insulator. In order to magnetically and electrically isolate regions 422 from one another it may therefore be desirable to implant through the layer 416 as illustrated in FIG. 4A. In one example, the layers 406, 410, and 414 may be cobalt and the layers 408 and 412 may be platinum. Each of these layers may be implanted in a separate step or in combination with other layers according to various embodiments. In addition, more than one different implantation step may be performed between successive deposition steps. For example it may be desirable to implant a thin layer of cobalt with different ions than those used to implant an adjacent layer of platinum. However, the total thickness of one cobalt layer and its adjacent platinum layer may be relatively small, such that the straggle does not vary significantly between the two implantation procedures. Accordingly, ion implantation may be performed into the cobalt layer and a subsequent ion implantation performed into an adjacent underlying platinum layer without depositing a layer between implantation procedures to adjust the gap between adjacent patterned structures, as may be necessary when the implant depth is to vary significantly between successive implantation steps.

The structure 430 in FIG. 4B includes a set of expanded patterned structures 402 disposed upon a stack of layers 432, 434, 436, 438, 440, 442, 444, and 446. The structure 430 includes implantation regions 450, which may result from multiple implantation processes as generally shown in the preceding FIGS. The implantation regions 450 may also serve to magnetically isolate regions 452 that lie under respective patterned structures 402. Because the implantation regions 450 are formed with the aid of caps 402B, deep implantation may be performed in which the resultant straggle of implanting ions does not move the border of the implantation regions 450 beyond a desired position. Accordingly, the implantation regions 450 may be maintained at a more uniform width throughout the stack of layers 432-448 as opposed to that achieved by conventional processing.

In one example, the layers 432, 436 and 440 may be cobalt, the layer 434 MgO, the layers 438 and 446 ruthenium, the layer 442 PtMn, the layer 444 Ta, and the layer 448 oxide. Each of these layers may be implanted in a separate step or in combination with other layers according to various embodiments. In addition, more than one different implantation step may be performed between successive deposition steps. As illustrated, the implantation regions 450 extend through layer 446, which may facilitate both electrical and magnetic isolation of adjacent regions 452.

In order to facilitate processing of substrates in which multiple operations including ion implantation and deposition occur, in various embodiments, apparatus are supplied to perform multiple operations including at least ion implantation and deposition. In one example, an apparatus may include a plasma chamber that is configured to perform both ion implantation and deposition. The gas composition may be altered between implantation and deposition steps in accordance with known methods. For example, to form the structures illustrated in FIGS. 4A, 4B, ions such as inert gas ions, nitrogen, oxygen, phosphorous, silicon may be generated in a plasma for implantation. In order to perform deposition of the cap 402B a known silicon-containing, carbon-containing or other precursor gas may be supplied to the plasma chamber to form ion species that result in deposition of a respective silicon or carbon containing material. The embodiments are not limited in this context.

Figure 5A:
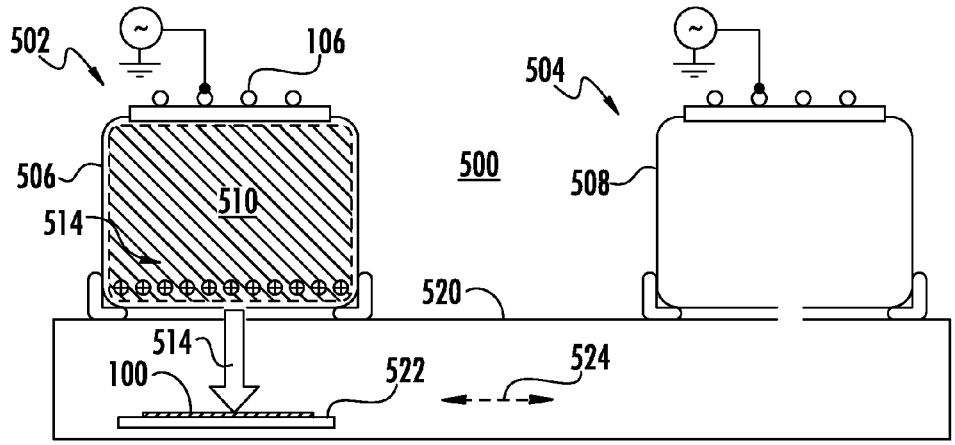
FIGS. 5A to 5C depict operation of an exemplary apparatus for patterning a substrate according to various embodiments.
Figure 5B:
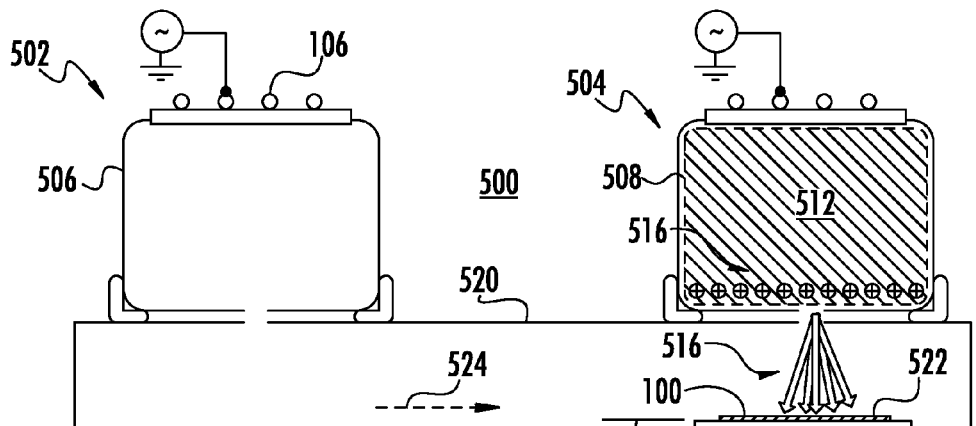
Figure 5C:
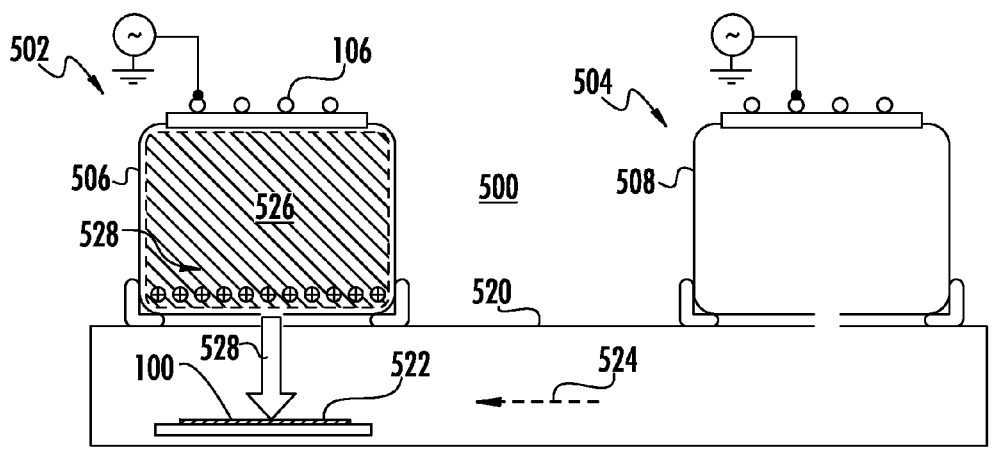

In additional embodiments, a multichamber apparatus is used in order to provide separate chambers to perform ion implantation as opposed to deposition. FIGS. 5A to 5C depict operation of a processing system 500 that includes multiple process chambers in accordance with the present embodiments. The multiple chambers may both be plasma chambers, for example. As shown in FIG. 5A, the plasma system 502 and plasma system 504 are each coupled to the process chamber 520 so that ions produced in the respective plasma chambers 506, 508 may be directed to substrates within the process chamber 520.

In one example, plasma chamber 506 is used for ion implantation and plasma chamber 508 is used for producing ions and/or ion-derived species for deposition. In the scenario specifically shown in FIG. 5A, a plasma 510 is generated in the plasma chamber 506, producing the implanting ions 514. The implanting ions 514 are extracted from the plasma chamber 506 and directed toward the substrate 100, which is disposed in a first position to intercept the implanting ions 514. After an implantation operation is performed, the substrate stage 522 may move the substrate 100 along the direction 524 to a second position to receive a deposition treatment. As shown in FIG. 4B the substrate 100 is moved to a position to intercept depositing ions 516 from a plasma 512 that is generated in the plasma chamber 508. In this case the depositing ions 516 may be effective to deposit material on substrate 100.

As illustrated in FIG. 5B depositing ions 516 may be directed to the substrate 100 over a range of angles, which may help to generate a mushroom-like top to patterned structures when the depositing ions 516 condense on the substrate 100, as generally illustrated in the preceding figures. In some embodiments, the plasma chamber 508 may include a plasma sheath modifier (PSM) as known in the art to generate depositing ions 516 over a desired angular range. A plasma sheath modifiers may act to modify a shape of a plasma sheath boundary proximate the region in which depositing ions 516 are extracted from the plasma chamber 508 and directed toward substrate 100. In particular, the plasma sheath boundary in regions where the plasma 512 faces the substrate 100 may assume a curved shape such that depositing ions 516 are extracted from the plasma 512 over a range of angles. Accordingly the depositing ions 516 impinge upon the substrate 100 over a range of angles with respect to a plane 525 of substrate 100 as illustrated. Additional description of general features of a processing system with a PSM can be found in co-pending U.S. patent application Ser. No. 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; and Ser. No. 12/848,354, filed Aug. 2, 2010, each of which is herein incorporated in its entirety by reference.

After an exposure to depositing ions 516 is completed, the substrate 100 may once more be moved to the first position to receive further ion treatment from plasma chamber 506. FIG. 5C illustrates the scenario in which a plasma 526 is generated in the plasma chamber 506 from which implanting ions 528 are extracted. The plasma 526 may be generally the same as the plasma 510 or may be different than the plasma 510 in different embodiments. In various embodiments, the implanting ions 528 are extracted with a different ion energy than are implanting ions 514 in order to perform a deeper implantation.

Figure 6A:
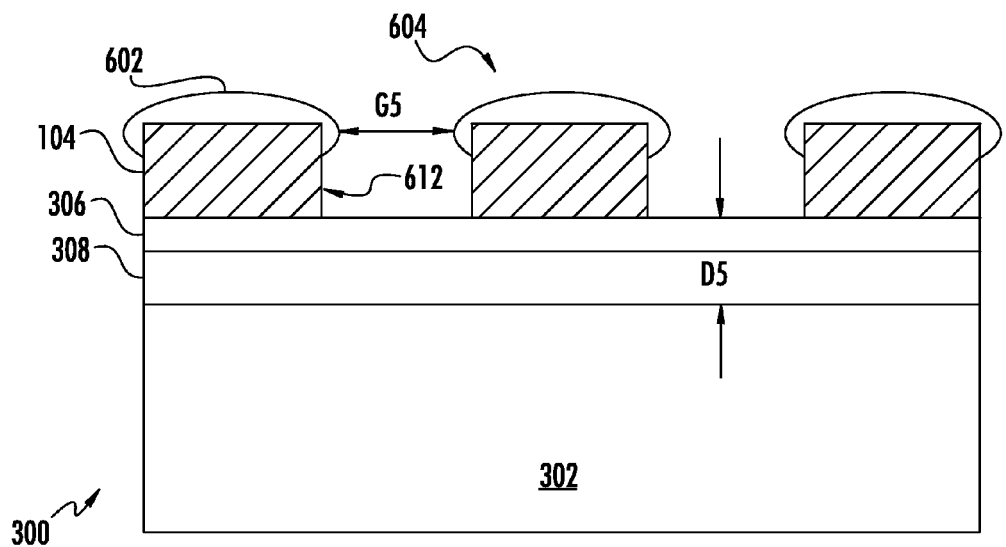
FIGS. 6A to 6B depict various processes involved in patterning a substrate consistent with another embodiment.
Figure 6B:
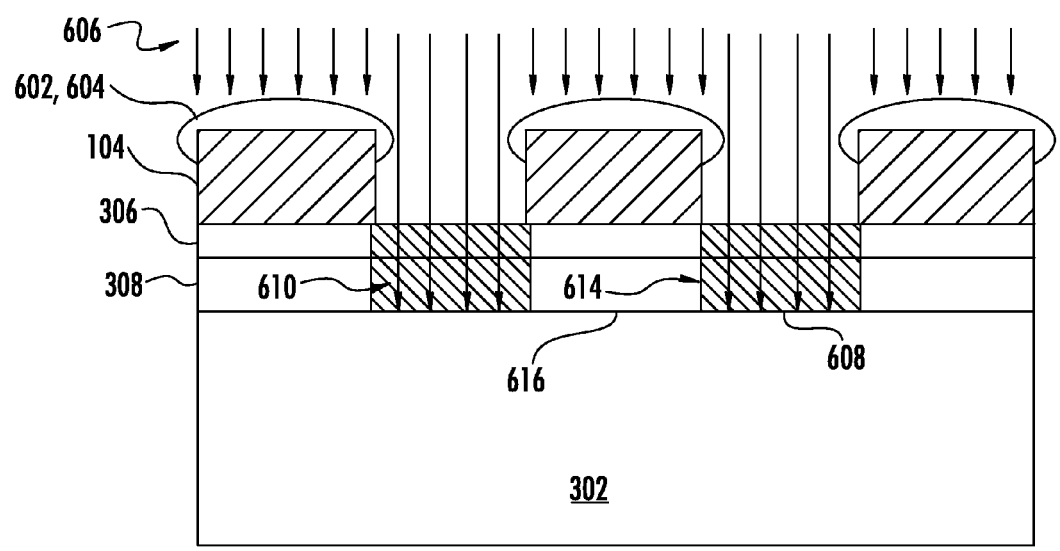

In additional embodiments, a single implantation procedure is employed to form implantation regions. FIGS. 6A to 6B depict different operations involved in processing a substrate according to a single implantation embodiment, In this case the substrate 300 includes the multiple layers including a base layer 302 and overlayer 308, top layer 306 and set of patterned structures 104 as discussed above with respect to FIGS. 3A-3C. In the operation depicted at FIG. 6A a deposit 602 is formed on the patterned structures 104 to form the expanded patterned structures 604. This results in a gap G5 between adjacent patterned structures. The gap G5 is arranged to accommodate lateral straggle resulting from implantation into the layers 306, 308 to the depth D5, which may represent the total depth of the layers 306, 308. Turning now to FIG. 6B ions 606 are implanted into the substrate 300. The unscreened ions that pass through the gap region between adjacent patterned structures 604 implant into the substrate 300 forming the implanted regions 608. Because the edge 610 of the ions 606 is spaced away from the edge 612 of the original patterned structures 104, the edge 614 of the implanted regions 608 does not excessively encroach under the patterned structures 104. The width of the regions 616 under the patterned structures 104 where the substrate 300 remains unimplanted may therefore be maintained at a desirable size even though a relatively deep implantation is performed.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of processing a substrate comprising;
   providing a set of patterned structures separated by a first gap on the substrate;
   directing first implanting ions to the substrate at a first ion energy during a first exposure, the first implanting ions effective to impact the substrate in regions defined by the first gap;
   directing depositing ions to the substrate in a second exposure subsequent to the first ion exposure, the depositing ions effective to deposit material on at least a portion of the set of patterned structures to form expanded patterned structures, the expanded patterned structures characterized by a second gap smaller than the first gap; and
   directing second implanting ions to the substrate at a second ion energy during a third exposure subsequent to the second exposure, the second implanting ions effective to impact the substrate in regions defined by the second gap, the second ion energy comprising a higher ion energy than the first ion energy, wherein the substrate is disposed in a first position during the first exposure, the method further comprising;
   moving the substrate to a second position before the second exposure;
   performing the second exposure while the substrate is disposed in the second position;
   moving the substrate to the first position before the third exposure;
   performing the third exposure while the substrate is disposed in the second position.

2. The method of claim 1, further comprising performing one or more exposure cycles, an exposure cycle comprising:
   directing additional implanting ions to the substrate at an ion energy higher than ion energy of implanting ions in a previous exposure; and
   directing additional depositing ions to the substrate, the additional depositing ions effective to deposit material on at least a portion of the set of patterned structures to form expanded patterned structures.

3. The method of claim 2, wherein a gap between patterned features decreases in dimension between successive exposure cycles.

4. The method of claim 1, further comprising:
   directing the first implanting ions by extracting the first implanting ions from a first source;
   directing the depositing ions by extracting the depositing ions from a second source; and
   directing the second implanting ions by extracting the second implanting ions from the first source.

5. The method of claim 4, wherein the first source comprising a first plasma source and the second source comprising a second plasma source.

6. The method of claim 1, wherein the directing the depositing ions comprising depositing the depositing ions at least on top portions of the patterned structures wherein the expanded patterned structures have a mushroom shape cross-section.

7. The method of claim 1, further comprising directing the second implanting ions over a range of angles of incidence with respect to a plane of the substrate.

8. The method of claim 1, wherein the first implanting ions generate a first ion straggle that is less than a second ion straggle generated by the second implanting ions.

9. The method of claim 1, wherein the first and second implanting ions are directed at a perpendicular incidence with respect to a plane of the substrate.

10. The method of claim 1, further comprising:
    directing third implanting ions to the substrate at a third ion energy, the third implanting ions effective to impact the substrate in regions defined by the first gap, wherein the directing the first implanting ions and the directing the third implanting ions are performed before the directing the depositing ions.

11. The method of claim 1, wherein the substrate is disposed in a first position during the directing the depositing ions, the method further comprising;
    Moving the substrate to a second position before the directing the implanting ions; and directing the implanting ions while the substrate is disposed in the second position.

12. The method of claim 1, wherein the directing depositing ions comprising depositing ions at least on top portions of the patterned structures wherein the expanded patterned structures have a mushroom shape cross-section.

* * * * *